(12) United States Patent
Yun

(10) Patent No.: US 8,946,614 B2
(45) Date of Patent: Feb. 3, 2015

(54) IMAGE SENSOR WITH WIDE DYNAMIC RANGE AND METHOD OF OPERATING THE SAME INCLUDING ONE OR MORE FIRST AND SECOND COLUMN GROUPS OF PIXELS ALTERNATIVELY ARRANGED

(71) Applicant: SK hynix Inc., Gyeonggi-do (KR)

(72) Inventor: Young-Hwan Yun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 218 days.

(21) Appl. No.: 13/716,364

(22) Filed: Dec. 17, 2012

(65) Prior Publication Data

US 2013/0248684 A1 Sep. 26, 2013

(30) Foreign Application Priority Data

Mar. 23, 2012 (KR) .......................... 10-2012-0030054
Aug. 17, 2012 (KR) .......................... 10-2012-0090027

(51) Int. Cl.
| H01L 27/00 | (2006.01) |
| H01L 27/146 | (2006.01) |
| H04N 5/355 | (2011.01) |
| H04N 5/345 | (2011.01) |
| H04N 5/347 | (2011.01) |
| H04N 5/3745 | (2011.01) |
| H04N 5/378 | (2011.01) |

(52) U.S. Cl.
CPC ...... *H01L 27/14609* (2013.01); *H04N 5/35554* (2013.01); *H04N 5/3458* (2013.01); *H04N 5/347* (2013.01); *H04N 5/3745* (2013.01); *H04N 5/378* (2013.01)

USPC .................................. 250/208.1; 250/214 R

(58) Field of Classification Search
USPC ........ 250/208.1, 214 R, 214.1; 348/302–314; 257/290–292, 440
See application file for complete search history.

(56) References Cited

U.S. PATENT DOCUMENTS 7,839,374 B2 * 11/2010 Kim et al. ..................... 345/100
2004/0028325 A1 2/2004 Fleury et al.

FOREIGN PATENT DOCUMENTS

| KR | 1020070064613 | 6/2007 |
| KR | 1020070064833 | 6/2007 |
| KR | 1020070065329 | 6/2007 |
| KR | 102009000503 | 1/2009 |

OTHER PUBLICATIONS

Young-Hwan Yun et al., "A study of wide dynamic range image without memory in digital circuit," Semiconductor for Smart Living Technologies, pp. 307-308, Feb. 17, 2012.

* cited by examiner

*Primary Examiner* — Que T Le
(74) *Attorney, Agent, or Firm* — IP & T Group LLP

(57) ABSTRACT

An image sensor in accordance with an embodiment of the present invention includes a pixel array configured to include a plurality of pixels corresponding to a plurality of rows and a plurality of columns that include one or more first column groups and one or more second column groups and are disposed in a direction crossing the plurality of rows and a data sampling unit configured to sample pixel data of a first column group of a first row and to sample pixel data of a second column group of a second row, wherein the first column group and the second column group are alternatively arranged.

25 Claims, 4 Drawing Sheets

IMAGE SENSOR WITH WIDE DYNAMIC RANGE AND METHOD OF OPERATING THE SAME INCLUDING ONE OR MORE FIRST AND SECOND COLUMN GROUPS OF PIXELS ALTERNATIVELY ARRANGED

CROSS-REFERENCES TO RELATED APPLICATIONS

The present application claims priority of Korean Patent Application Nos. 10-2012-0030054 and 10-2012-0090027, filed on Mar. 23, 2012 and Aug. 17, 2012, which are incorporated herein by reference in its entirety.

BACKGROUND

1. Field

Exemplary embodiments of the present invention relate to an image sensor and a method of operating the same.

2. Description of the Related Art

Recently, a demand for a digital camera module has increased with the development of image communications using the Internet.

The digital camera module includes an image sensor. The image sensor is a device that converts an optical image into an electrical signal. As the image sensor, a charge coupled device (CCD) and a complementary metal-oxide-semiconductor (CMOS) image sensor have been widely used.

The CCD has disadvantages in that a driving method is complicated, power consumption is increased, a process is complicated due to many mask processes in a manufacturing process, and a signal processing circuit may not be implemented within a chip to have a difficulty in implementing a one-chip. On the other hand, a CMOS image sensor has been more spotlighted recently, since control circuit, driving circuit, and signal processing circuit are integrated on a single chip as a monolithic IC. In addition, the CMOS image sensor may be more economically competitive than the existing CCD, due to a low voltage operation, low power consumption, compatibility with peripheral devices, and utility of a standard CMOS manufacturing process.

One of the criteria for indicating performance of the image sensor is a dynamic range. The dynamic range generally represents a maximum range that may process a signal without distorting an input signal. As the dynamic range is increased, the image sensor may obtain a good image, regardless of whether brightness is widely changed.

The dynamic range of the image sensor is in proportion to an amount of data to be processed by the image sensor. However, the amount of data that may be processed by the image sensor is limited, so that the image sensor may not represent all the dynamic ranges of the natural world. When the dynamic range of the image acquired by the image sensor is insufficient, a histogram of an image is biased to a dark area or a bright area, so that light may be saturated. Meanwhile, even when portions having actually different brightness are present in the acquired image, a dark area is biased to a narrow dynamic range or light is saturated in a bright area, so that it may be difficult to differentiate objects within the image. In severe cases, even though objects are actually present, objects may not be seen due to an insufficient dynamic range.

The image sensor integrates photo charges generated in response to light incident through each pixel included in the image sensor to convert an optical signal into an electrical signal, thereby acquiring an image. The image sensor generally acquires an actual appearance of the natural world as is, but may acquire a darker or brighter image than an actual image based on integration time within which light is collected. That is, as the image sensor collects light for a long period of time, the image sensor may obtain a brighter image. Therefore, the integration time of the dark area is short, and when an image is too bright, it may be considered that the integration time of the saturated area is increased.

A method for extending the dynamic range of the image sensor may refer to Korean Patent Application No. 10-2007-0064613 (entitled as "method and apparatus for improving dynamic range of images", which is incorporated herein by reference in its entirety) and the like. Korean Patent Application No, 10-2007-0064613 discloses a method for extending a dynamic range of an image acquired by an image sensor using a nature in which the gradation expression of a dark area is abundant with the increased integration time of light (or, photo charge) and the gradation expression of a bright area is abundant with the reduced integration time of light.

Describing in more detail, in an image sensor including a pixel array in which a plurality of pixels are disposed in a matrix form, the integration time of pixels of some rows (hereinafter, referred to as "first rows") is set to be long and the integration time of pixels of the remaining rows (hereinafter, referred to as "second rows") adjacent to some rows is set to be short. Further, the image sensor stores pixel data of the first rows and pixel data of the second rows and interpolate the data to generate new data configuring an image, thereby obtaining the advantages when the integrated time is increased and when the integrated time is reduced.

However, to interpolate the pixel data included in one row and the pixel data included the other row, the image sensor generally stores the pixel data included in two rows and calculates the data, thereby generating new data. Therefore, the image sensor has concerns in that the chip size is increased due to the memory for storing data and the time to acquire the image data is increased due to the increased calculation time.

SUMMARY

Exemplary embodiments of the present invention are directed to an image sensor having a fast image acquiring speed, i.e., an increased frame rate, and a wide dynamic range and a method of operating the same.

Other embodiments of the present invention are directed to an image sensor with the reduced area by eliminating a memory for storing data of pixels having different integration time and a method of operating the same.

In accordance with an embodiment of the present invention, an image sensor includes a pixel array configured to include a plurality of pixels corresponding to a plurality of rows and a plurality of columns that include one or more first column groups and one or more second column groups and are disposed in a direction crossing the plurality of rows; and a data sampling unit configured to sample pixel data of a first column group of a first row and to sample pixel data of a second column group of a second row, wherein the first column group and the second column group are alternatively arranged.

In accordance with another embodiment of the present invention, a method of operating an image sensor including a plurality of pixels corresponding to a plurality of rows and a plurality of columns where include one or more first column groups and one or more second column groups and are disposed in a direction crossing the plurality of rows, the method includes sampling pixel data of a first column group of a first row in the pixel array; and sampling pixel data of the second column group where are alternatively arranged with the first column group.

DETAILED DESCRIPTION

Figure 1:
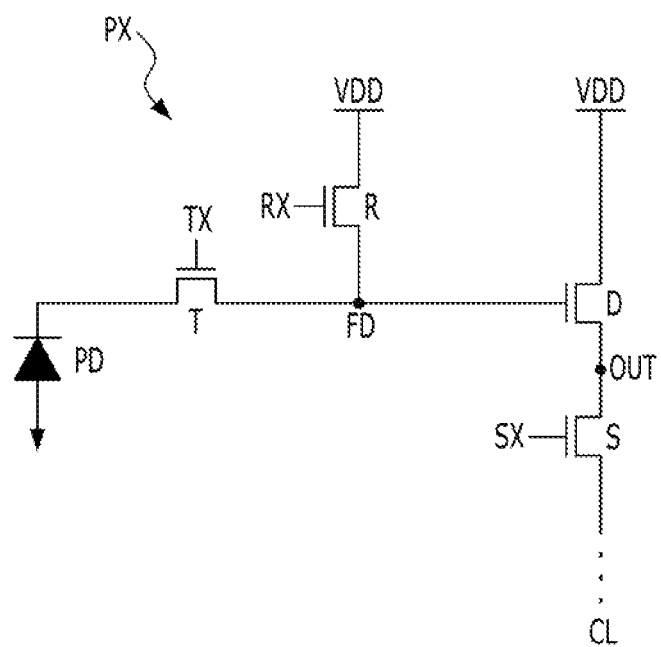
FIG. 1 is a circuit diagram illustrating configuration of a pixel included in a conventional image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a diagram illustrating configuration of a pixel included in a conventional image sensor.

As illustrated in FIG. 1, a pixel PX includes a photo diode PD, a reset transistor R, a transmission transistor T, a driving transistor D, and a selection transistor S.

Hereinafter, the pixel PX will be described with reference to FIG. 1.

The photo diode PD generates photo charges due to light incident to the pixel PX and a level of an output signal of the pixel PX is changed based on an amount of photo charges integrated by the photo diode PD. In order to accurately sample the output signal of the pixel PX, the photo diode PD is reset to an initial state before integration time starts. The reset photo diode PD integrates photo charges for the integration time. The integration time may be changed according to a design and a control. The length of the integration time may be controlled by controlling a turn on/off time of the transmission transistor T and may be set in a clock unit, where the image sensors are operated in synchronization with the clock.

When the integration of photo charges by the photo diode PD is completed, the pixel data having a level corresponding to the amount of integrated photo charges are sampled. In this case, in order to offset a fixed pattern noise (FPN) due to a mismatch of signal processing circuits of a sensor, the pixel data are sampled by a correlated double sampling (CDS) method. The sampling of the pixel data by the correlated double sampling is performed by the following order.

First, the reset transistor R is turned on in response to a reset signal RX, so that a floating diffusion node FD is driven by a power supply voltage source VDD. The driving transistor D pull-up drives an output node OUT in response to voltage of the floating diffusion node FD to generate the output signal of the pixel PX, and a selection signal SX is activated so that the output signal of the pixel PX is sampled by a data sampling circuit (not illustrated in FIG. 1). In this case, a level of the output signal of the pixel PX is a reset level.

Next, the transmission transistor T is turned on in response to a transmission signal TX to transmit photo charges integrated by the photo diode PD to the floating diffusion node FD, thereby changing the voltage of the floating diffusion node FD. The driving transistor D pull-up drives the output node OUT in response to voltage of the floating diffusion node FD to generate the output signal of the pixel PX and the selection signal SX is activated so that the output signal of the pixel PX is sampled by the data sampling circuit. In this case, the level of the output signal of the pixel PX is a signal level determined by the amount of photo charges integrated by the photo diode PD.

At the time of the foregoing sampling operation, the selection transistor S maintains a turn-on state in a period in which the output signal of the pixel PX is sampled. When the selection transistor S is turned on, the output node OUT is connected with a column line CL.

The image sensor generates the data of the pixel (referred to as "pixel data") that are digital signals having values corresponding to photo charges integrated by the photo diode PD included in the pixel PX, through the foregoing process.

Figure 2:
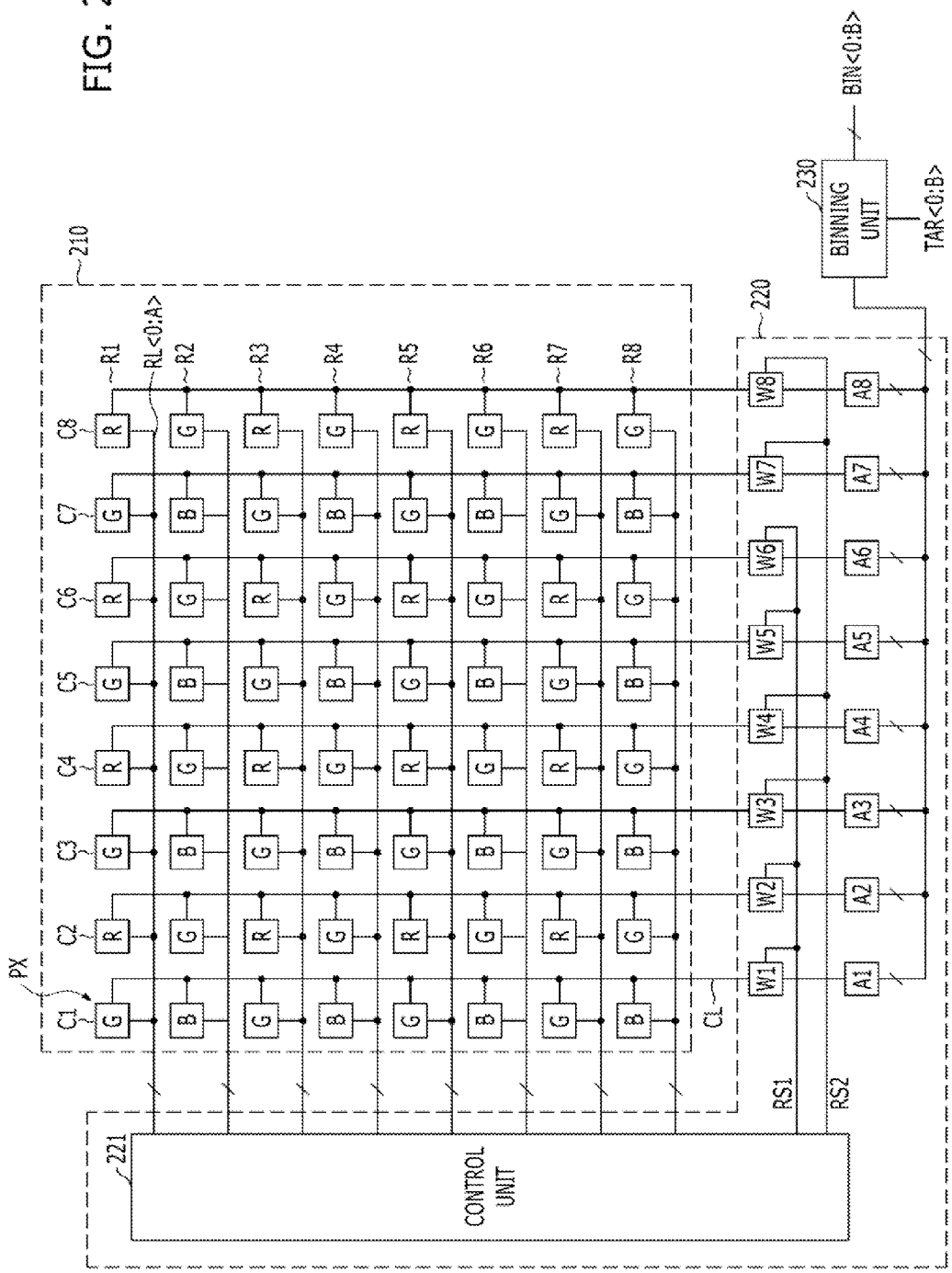
FIG. 2 is a diagram illustrating configuration of an image sensor in accordance with an embodiment of the present invention.

FIG. 2 is a diagram illustrating configuration of an image sensor in accordance with an embodiment of the present invention.

As illustrated in FIG. 2, the image sensor includes a pixel array 210, a data sampling unit 220 and a binning unit 230. The pixel array 210 is configured to include a plurality of pixels PX corresponding to a plurality of rows and columns arranged in a matrix form. The data sampling unit 220 is configured to sample pixel data of given columns of a first row and sample pixel data of the remaining columns except for the given columns of a second row, in the pixel array 210. The binning unit 230 is configured to calculate tuned values of the pixel data.

Hereinafter, the image sensor be described with reference to FIGS. 1 and 2.

A case in which the pixel array 210 includes a pixel in which eight rows R1 to R8 and eight columns C1 to C8 are arranged will be described. The number and disposition of pixels PXs included in the pixel array may be changed according to a design.

Here, the pixels PXs that are arranged in the same row share signals RX, TX, and SX for controlling transistors R, T, and S included in each pixel and transmit the signals RX, TX, and SX to the pixels PXs arranged in the same row through at least one row line RL<0:A>. Therefore, the pixels PXs arranged in the same row have the same integration time, and the sampling (reset level sampling and signal level sampling) of the output signal is performed on the pixels PXs within the same period. Further, the pixels PXs arranged in the same column share a column line CL and the output signal of the pixel PX transmitted through the column line CL is sampled by the data sampling unit 220.

Each of pixels PXs included in the pixel array 210 of FIG. 2 may include components illustrated in FIG. 1, but is not necessarily limited to a configuration of FIG. 1, and therefore, may be changed according to a design. For reference, among the plurality of pixels PXs, a pixel represented by 'R' indicates a red pixel, a pixel represented by 'G' indicates a green pixel, and a pixel represented by IT indicates a blue pixel.

Each of the plurality of rows included in the pixel array 210 may have the integration time that may be set differently. A half (corresponding to the first row) of the plurality of rows included in the image sensor of FIG. 2 has integration time that is set to a first period and the pixels included in the remaining half (corresponding to the second row) thereof has integration time that is set to a second period longer than the first period. Hereinafter, the case in which 'R1, R2, R5, R6' correspond to the first row and 'R3, R4, R7, R8' correspond to the second row will be described. On the other hand, the integration time may also be set so that the 'R1, R2, R5, R6' correspond to the second row and the 'R3, R4, R7, R8' correspond to the first row.

The first row and the second row may be neighboring rows among rows having the same pixel patterns. For example, when the 'R1' having a 'GR' pattern is the first row, the 'R3' adjacent to the 'R1' while having the 'GR' pattern may be the second row. Further, when the 'R6' having a 'BG' pattern is the first row, the 'R4' or 'R8' having the 'BG' pattern may be the second row. Here, the 'GR' pattern indicates a pattern in which the green pixel (G) and the red pixel (R) are alternately arranged and the 'BG' pattern indicates a pixel pattern in which the blue pixel B and the green pixel G are alternately arranged.

The data sampling unit 220 samples the pixel data of at least two rows together. Describing in more detail, the data sampling unit 220 samples the pixel data of the given columns of the first row and samples the pixel data of the remaining columns except for the given columns of the second row. The data sampling unit 220 samples the pixel data of the given columns of the first row in a period in which the first row is selected and the pixel data of the remaining columns except of the second row in a period in which the second row is selected. FIG. 2 illustrates the case in which the pixel data of the given columns 'C1, C2, C5, C6' of the first row and the pixel data of the remaining columns 'C3, C4, C7, C8' of the second row are sampled together. The integration time of the first row is the first period and the integration time of the second row is the second period longer than the first period, so that the image sensor of FIG. 2 samples the pixel data having the short integration time and the pixel data having the long integration time together.

For reference, a period in which any row is selected indicates a period in which the output signals of the pixels of the corresponding row are output through the column lines CLs. Referring to FIG. 1, the selection signals SX corresponding to the pixels of the corresponding row are activated in a period in which any row is selected, so that the selection transistors S included in each pixel of the corresponding row are turned on and the output nodes OUT of each pixel of the corresponding row are electrically connected with the corresponding column lines CLs. For example, the selection signal SX corresponding to the row R1 is activated in a period in which the row R1 is selected, so that the selection transistors S included in each pixel of the row R1 are turned on and the output nodes OUT of the pixels of the first row each are electrically connected with the corresponding column lines CL.

As described above, the reason of sampling the pixel data of the given columns of the first row and the pixel data of the remaining columns except for the given columns of the second row together is to perform a binning operation of generating new data at high speed by calculating the tuned values of the sampled data from the pixel of the corresponding column.

The given columns C1, C2, C5, and C5 in the pixel array 210 include at least one first column group including at least one column, and the remaining columns C3, C4, C7, and C8 except for the given columns include at least one second column group including at least one column. The first column and the second column group are alternately arranged. In FIG. 2, the group including 'C1, C2' and the group including 'C5, C6' correspond to the first column group and the group including 'C3 C4' and the group including 'C7, C8' correspond to the second column group. As illustrated in FIG. 2, the first column group and the second column group are alternately arranged in the pixel array 210. Hereinafter, the case in which the pixel data of the 'C1, C2, C5, C6' of the 'R1' (first row) and the data of the columns of 'C3, C4, C7 C8' of the 'R3' (third row) are sampled will be described.

For the foregoing sampling operation, the data sampling unit 220 includes at least one analog-to-digital conversion unit A1 to A8, at least one voltage transfer unit W1 to W8, and a control unit 221. The analog-to-digital conversion unit A1 to A8 is configured to correspond to a plurality of columns one to one, and convert the output signals of the pixels output from the columns corresponding to the analog-to-digital conversion units A1 to A8 into data that are digital signals. The voltage transfer unit W1 to W8 is configured to correspond to at least one column of the plurality of columns one to one and transfer or block the output signals of the pixels output from the columns corresponding to the voltage transfer units W1 to W8. The control unit 221 is configured to activate the voltage transfer units W1, W2, W5, and W6 corresponding to the given columns C1, C2, C5, and C6 included in at least one first column group among the voltage transfer units W1 to W8 in a period in which the first row is selected and activates the voltage transfer units W3, W4, W7, and W8 corresponding to the remaining columns C3, C4, C7, and C8 included in at least one second column group among the voltage transfer units W1 to W8 in a period in which the second row is selected.

The control unit 221 controls an operation of the pixels included in the pixel array 210 in a row unit. First, the control unit 221 performs a control to reset the photo diode PD of the pixels of the row to be sampled and then, integrate photo charges for the integration time set by the photo diode PD. In this case, the control unit 221 controls the row corresponding to the first row to integrate photo charges for the first period and the row corresponding to the second row to integrate photo charges for the second period. At the time of sampling the output signals of the pixels of the 'R1' and 'R3' the control unit 221 controls the pixels of the first row R1 to integrate photo charges for the first period and the pixels of the second row R3 to integrate photo charges for the second period longer than the first period.

When the integration of photo charges are completed, the control unit 221 performs a control to output the output signal of the reset level to the output nodes OUTs of the pixels of the first row R1 in a period in which the first row R1 is firstly selected and performs a control to output the output signal of the reset level to the output nodes OUTs of the pixels of the second row R3 in a period in which the second row R3 is firstly selected. Further, the control unit 221 performs a control to output an output signal of a signal level to the output nodes OUTs of the pixels of the first row R1 in a period in which the first row R1 is secondly selected and performs a control to output the output signal of the signal level to the output nodes OUTs of the pixels of the second row R3 in a period in which the second row R3 is secondly selected.

In the period in which the first row R1 is selected, the control unit 221 activates a first transfer signal RS1 for activating the voltage transfer units W1, W2, W5, and W6 corresponding to the first column group C1 C2 C5 and C6, and inactivates a second transfer signal RS2 for activating the voltage transfer units W3, W4 W7, and W8 corresponding to the second column group C3, C4, C7, and C8. Therefore, the output signals of the pixels of the given columns C1, C2, C5, and C6 of the first row R1 are transferred to the analog-to-digital conversion units A1, A2, A5, and A6 and the output signals of the pixels of the remaining columns C3, C4, C7, and C8 of the first row R1 are not transferred to the analog-to-digital conversion units A3 A4, A7, and A8.

Further, in the period in which the second row R3 is selected, the control unit 221 inactivates the first transfer signal RS1 for activating the voltage transfer units W1, W2, W5, and W6 corresponding to the first column group C1, C2, C5, and C6, and activates the second transfer signal RS2 for activating the voltage transfer units W3, W4, W7, and W8 corresponding to the second column group C3, C4, C7, and C8. Therefore, the output signals of the pixels of the given columns C1, C2, C5, and C6 of the second row R3 are not transferred to the analog-to-digital conversion units A1, A2, A5, and A6 and the output signals of the pixels of the remaining columns C3, C4, C7, and C8 of the second row R3 are transferred to the analog-to-digital conversion units A3, A4, A7, and A8.

The voltage transfer units W1, W2, W5, and W6 corresponding to the first column group C1, C2, C5, and C6 among the voltage transfer units W1 to W8 may be transistors that are each connected between the column lines CLs corresponding thereto and the analog-to-digital conversion units A1, A2, A5, and A6 and are turned on when the first transfer signal RS1 is activated. On the contrary, the voltage transfer units W3, W4, W7, and W8 corresponding to the second column group C3, C4, C7, and C8 may be transistors that are each connected between the column lines CLs corresponding thereto and the analog-to-digital conversion units A3, A4, A7, and A8 and are turned on when the second transfer signal RS2 is activated.

The analog-to-digital conversion units A1 to A8 convert the output signals of the pixels transferred to the column lines CLs corresponding thereto into the data that are digital signals. In this case, some analog-to-digital conversion units A1, A2 A5, and A6 of the analog-to-digital conversion units A1 to A8 convert the output signals of the given columns C1, C2, C5, and C6 of the first row R1 into data that are the digital signals. Further, the remaining analog-to-digital conversion units A3, A4, A7, and A8 convert the output signals of the remaining columns C3, C4, C7, and C8 of the second row R3 into data that are the digital signals. The analog-to-digital conversion units A1 to A8 convert the output signals of the pixels transferred from the activated voltage transfer units W1, W2, W5, and W6 among the voltage transfer units W1 to W8 in the period in which the first row R1 is selected and the output signals of the pixels transferred from the activated voltage transfer units W3, W4, W7, and W8 among the voltage transfer units W1 to W8 in a period in which the second row R3 is selected into data. Here, the 'together converting' does not necessarily convert the simultaneous conversion, but means conversion within a one-time conversion period. That is, the A1, A2, A5, and A6 output the pixel data obtained by converting the pixel signals output from the given pixels of the first row R1 into the digital signals, and the A3, A4, A7, and A8 output the pixel data obtained by converting the pixel signals output from the remaining pixels of the second row R3 into the digital signals, within the one-time conversion period.

In the case of the related art, since only the pixel signal of one row is output within the one-time conversion period and is converted into the pixel data, two conversion periods are required to obtain the pixel data having the long integration time and the pixel data having the short integration time. However, in the case of the embodiment of the present invention, some of the analog-to-digital conversion units output the pixel data having the long integration time within the one-time conversion period and the remaining thereof output the pixel data having the short integration time, so that both of the pixel data having the long integration time and the pixel data having the short integration time may be obtained within the one-time conversion period. Therefore, the binning operation may be immediately performed using the pixel data output within the one-time conversion period.

For reference, when each analog-to-digital conversion unit outputs the digital signals of K bits, '×K' indicates that the number of output lines of the analog-to-digital conversion unit is K. All the output lines of the analog-to-digital conversion units are connected with the binning unit 230 and thus, the number of lines input to the binning unit 230 is 8K which is represented by '×8K'.

The binning unit 230 calculates the tuned values of some of the data output from at least one analog-to-digital conversion units A1 to A8 to generate new data. The binning unit 230 calculates the tuned values of the values of the pixel data output from at least one of the given columns C1, C2, C5, and C6 of the first row R1 and the values of the pixel data output from at least one of the remaining columns C3, C4, C7, and C8 except for the given columns of the second row R3. In this case, the tuned value may be a general tuned value calculated without allocating weighted values to specific data and may be a tuned value calculated by allocating weighted values to specific data. The operation is referred to as binning of the pixel data. Here, the binning is performed using the pixel data of one color. That is, new data are generated by calculating the tuned values of the data group of the green pixel, the data group of the red pixel, and the data group of the blue pixel.

In the image sensor of FIG. 2, the binning unit 230 calculates the tuned values of the values of the data output from the first analog-to-digital conversion unit A1 and the third analog-to-digital conversion unit A3, respectively, the tuned values of the values of the data output from the second analog-to-digital conversion unit A2 and the fourth analog-to-digital conversion unit A4, and the tuned values of the values of the data output from the sixth analog-to-digital conversion unit A6 and the eighth analog-to-digital conversion unit A8 to generate binning data BIN<0:B>.

The data output from the first analog-to-digital conversion unit A1 corresponds to one obtained by converting the output signal of the pixel included in the first row R1 and therefore, becomes the pixel data of which the integration time is the first period (short integration time) and the data output from the third analog-to-digital conversion unit A3 corresponds to one obtained by converting the output signal of the pixel included in the second row R3 and therefore, becomes the pixel data of which the integration time is the second period (long integration time). Therefore, the binning data BIN<0:B> that are the tuned values of the value of the data output from the first analog-to-digital conversion unit A1 and the value of the data output from the third analog-to-digital conversion A3 are data having the advantages when the integration time is short and when the integration time is long. That is, the image obtained as the binning data BIN<0:B> has the abundant gradation expression in both of the bright area and the dark area.

Similarly, the binning data BIN<0:B> generated by using the data output from the second analog-to-digital conversion unit A2 and the data output from the fourth analog-to-digital conversion unit A4, the binning data BIN<0:B> generated by using the data output from the fifth analog-to-digital conversion unit A5 and the data output from the seventh analog-to-digital conversion unit A7, and the binning data BIN<0:B> generated by using the data output from the sixth analog-to-digital conversion unit A6 and the data output from the eighth analog-to-digital conversion unit A8 have the same advantage.

In order to obtain more abundant gradation expression, the tuned value may be calculated by allocating the weighted values to the data of the specific pixel to generate the binning data BIN<0:B>. A human may best differentiate objects in specific brightness and a value of a data corresponding to a brightness value of the specific brightness is referred to as a target value TAR<0:B>. When the tuned value is obtained, the weighted value is controlled so that the value of the binning data BIN<0:B> is controlled to approximate the target value TAR<0:B>, so that the gradation expression of the image configured of the plurality of binning data BIN<0:B> may be more abundant. Here, the target value TAR<0:B> may be obtained by a test and may be changed according to a design.

In order to generate the binning data BIN<0:B>, the binning unit 230 calculates the tuned values by allocating the larger weighted values to the values of the pixel data output from at least one of the remaining columns C3, C4, C7, and C8 of the second row R3, when the values of the pixel data output from at least one of the given columns C1, C2, C5, and C6 of the first row R1 and the values of the pixel data output from at least one of the remaining columns C3, C4, C7, and C8 of the second row R3 are smaller than the target value TAR<0:B>. For example, since the case in which both of the value of the pixel data of Cr of the first row R1 and the value of the pixel data of 'C3' of the second row R3 are smaller than the target value TAR<0:B> indicates that the acquired image is dark, a larger weighted value is allocated to the value of the pixel data of 'C3' of the second row R3 having the relatively long integration time, so that the brightness of the acquired image may be increased to approximate the brightness corresponding to the target value TAR<0:B>.

Further, the binning unit 230 calculates the tuned values by allocating the larger weighted values to the values of the pixel data output from at least one of the given columns C1, C2, C5, and C6 of the first row R1 when the values of the pixel data output from at least one of the given columns C1, C2, C5, and C6 of the first row R1 and the values of the pixel data output from at least one of the remaining columns C3, C4, C7, and C8 of the second row R3 are larger than the target value TAR<0:B>. For example, since the case in which both of the value of the pixel data of 'C1' of the first row R1 and the value of the pixel data of 'C3' of the second row R3 are smaller than the target value TAR<0:B> indicates that the acquired image is dark, a larger weighted value is allocated to the value of the pixel data of 'C3' of the second row R3 having the relatively long integration time, so that the brightness of the acquired image may be increased to approximate the brightness corresponding to the target value TAR<0:B>.

Describing in more detail the method of obtaining the tuned values by the binning unit 230, the following two methods may be used.

Hereinafter, the data output from one of the given columns C1, C2, C5, and C6 of the first row R1 is referred to as a first data and the data output from a column adjacent to the column outputting the first data among the remaining columns C3, C4, C7, and C8 except for the given columns of the second row R2 is referred to as a second data. That is, the first data is a pixel data having a short integration time and the second data is a pixel data having a long integration time. For example, when the data obtained by converting the output signal of the pixel of 'C1' of the first row R1 into the digital signal is the first data, the data obtained by converting the output signal of the pixel of 'C3' of the second row R3 into the digital signal is the second data.

The binning unit 230 allocates the larger weighted value to the values of the second data when the values of the first data and the second data are smaller than the target value TAR<0: B> and calculates an average of the first data and the second data, and allocates the larger weighted value to the values of the first data when the values of the first data and the second data are larger than the target value TAR<0:B> and calculates the average of the first data and the second data.

(1) The binning unit 230 may calculate the tuned values of the first data and the second data depending on the following Equation 1 when the values of the first data and the second data are larger than the target value TAR<0:B> and calculate the tuned values of the first data and the second data depending on the following Equation 2 when at least one of the values of the first data and the second data is smaller than the target value TAR<0:B>, $$\frac{\begin{pmatrix} \text{value of first data} * \text{value of second data} + \\ \text{value of second data} * \text{value of first data} \end{pmatrix}}{(\text{value of first data} + \text{value of second data})} \quad [\text{Equation 1}]$$

$$\frac{\begin{pmatrix} \text{value of first data} * \text{value of first data} + \\ \text{value of second data} * \text{value of second data} \end{pmatrix}}{(\text{value of first data} + \text{value of second data})} \quad [\text{Equation 2}]$$

(2) In addition, the binning unit 230 may calculate the tuned values of the first data and the second data depending on the following Equation 3.

$$\frac{\begin{pmatrix} \text{value of second data} * \\ \begin{pmatrix} \text{maximum value of data} - \\ \text{value of first data} \end{pmatrix} + \\ \text{value of first data} * \text{value of first data} \end{pmatrix}}{\text{maximum value of data}} \quad [\text{Equation 3}]$$

Here, a maximum value of the data means a maximum value of a code that may be included in the pixel data. For example, when the pixel data is 8 bits, the maximum value of the data becomes '11111111'. For reference, as the brightness of sampled light in the pixel is dark, the value of the pixel data approximates '00000000' and as the brightness of sampled light in the pixel is bright, the value of the pixel data approximates '11111111'.

The tuned values are generated using the first data and the second data based on the method (1) or (2), thereby increasing the gradation expression of the dark portion or the bright portion in the image.

The image sensor in accordance with the embodiment of the present invention differently sets the integration time of the plurality of rows of the pixel array 210 and selects at least two rows having the same pixel pattern and adjacent to each other among the plurality of rows and having different integration time together to sample the output signals of the pixels of the selected rows together. In order to sample the pixel data of at least two rows together, a sub sampling mode in which columns do not overlap each other performs sub sampling on each row that does not sample the output signals of the pixels of all the columns in each row but samples the output signals together. Further, the binning data are generated by calculating the tuned values of the values of the pixel data in which the integration time is the first period and the values of the pixel data in which the integration time is the second period, among the data obtained by converting the sampled output signals into data.

For example, in the case of the image sensor of FIG. 2, the output signals of the pixels of 'C1, C2, C5, C6' of the first row in which the integration time is the first period and the output signals of the pixels of 'C3, C4, C7, C8' of the second row in which the integration time is the second period are sampled together, as described above. Further, the binning data BIN<0:B> are generated by binning the data obtained by converting the output signals of the pixels of 'C1 C2, C5, C6' of the first row and the data obtained by converting the output signals of the pixels of 'C3, C4, C7, C8' of the second row.

That is, the image sensor in accordance with the embodiment of the present invention greatly reduces the time to sample the rows of the overall pixel array 210 to calculate the tuned values of the data pixel having different integration time while increasing the frame rate, thereby increasing the gradation expression of the image obtained by generating the binning data. Further, since there is no need to store the data sampled in each row in order to calculate the tuned values, the memory for storing the data is not required, so that the area of the image sensor may be reduced.

FIG. 2 illustrates the image sensor including the pixel array in which the row having different pixel patterns are arranged between the rows having the same pixel pattern one by one (The 'GR' pattern and the 'BG' pattern are alternately arranged, so that the row having the 'BG' pattern is arranged between the adjacent rows having the 'GR' pattern and the row having the 'GR' pattern is arranged between the adjacent rows having the 'BG' pattern). However, the pixel array of the image sensor in accordance with the embodiment of the present invention is not limited to the embodiment of FIG. 2 but the row having different pixel patterns may not be present between the rows having the same pixel pattern and at least two rows may be present, according to a design.

For example, when the image sensor in accordance with the embodiment of the present invention is an image sensor acquiring a monochrome image, the row having different patterns may not be present between the rows having the same pattern. In this case, the image sensor samples the output signals of the pixels of two adjacent rows together. In this case, one of the adjacent rows has the short integration time and the other thereof has the long integration time. One row may sample the output signals of the pixels of odd-numbered columns and the other row may sample the output signals of the pixels of even-numbered columns (and vice versa). Further, the image may obtained by binning (the binning data are generated by calculating the tuned values of values of each data) the output signals of the pixels of odd-numbered columns and the output signals of the pixels of even-numbered columns.

Further, the image sensor of FIG. 2 is an image sensor performing the digital binning that converts the output signals of the pixels into data that are the digital signals and calculates the tuned values of the values the data to generate the binning data, but may also perform the binning prior to performing the analog-to-digital conversion according to a design. Korean Patent Application No, 10-2010-0065329 (entitled as "column circuit and pixel binning circuit of image sensor") discloses a method of performing binning prior to converting the output signal's of the pixels into data, which is incorporated herein by reference in its entirety.

Figure 3:
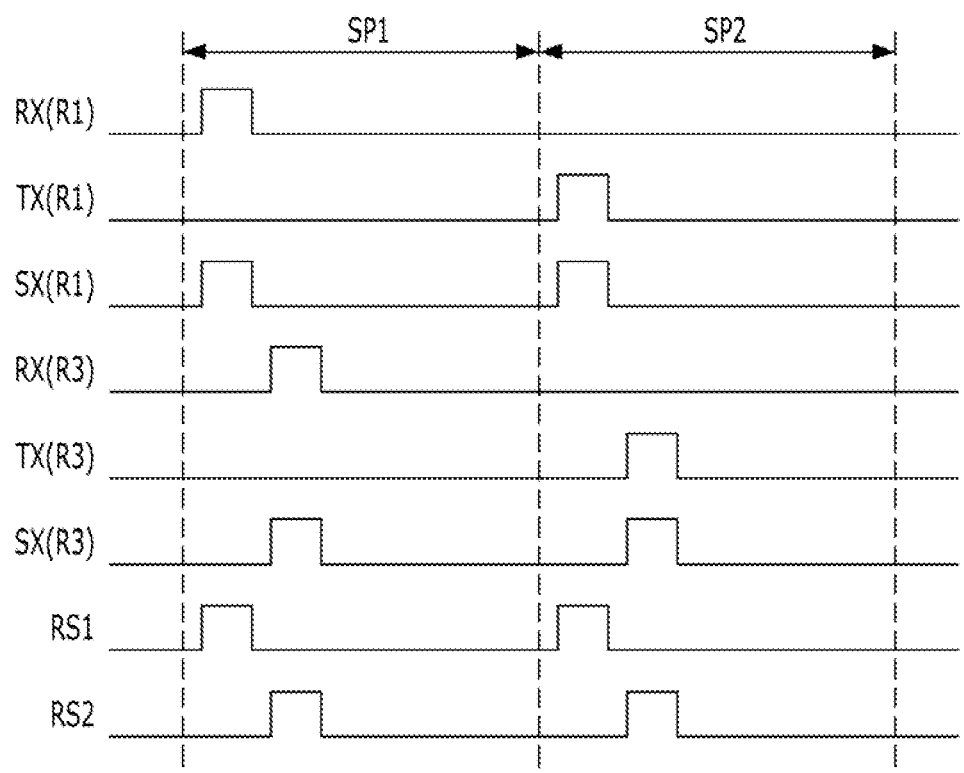
FIG. 3 is a waveform diagram for describing an operation of the image sensor shown in FIG. 2.

FIG. 3 is a waveform diagram for describing an operation of the image sensor shown in FIG. 2.

Hereinafter, the operation of the image sensor in accordance with the embodiment of the present invention will be described with reference to FIGS. 1 to 3. For reference, as described above, an operation of allowing the pixels of each row to integrate photo charges is completed prior to sampling the output signals of the pixels of the corresponding rows. Hereinafter, an operation of sampling the output signals of the pixels to an operation of calculating the tuned values of two data output from the adjacent analog-to-digital conversion units to generate the binning data BIN<0:B> will be described. The references 'RX(R1)', 'TX(R1)', and 'SX (R1)' each indicate waveforms of a reset signal, a transmission signal, and a selection signal of the pixels of the first row R1, 'RX(R3)', 'TX(R3)', and 'SX(R3)' each indicate waveforms of a reset signal, a transmission signal, and a selection signal of the pixels of the second row R3, and 'RS1' and 'RS2' each indicate waveforms of a first transfer signal and a second transfer signal.

When 'R1' and 'R3' each are a first row and a second row, a process of sampling the output signals of the pixels of the first row R1 and the second row R3 to perform the binning operation is as follows.

The selection signal SX(R1) corresponding to the first row R1 is activated (the first row R1 is selected) in a first sampling period SP1 so that the selection transistors S of the pixels of the first row R1 are turned on and the reset signal RX(R1) corresponding to the first row R1 is activated so that the reset transistors R of the pixels of the first row R1 are turned on, thereby outputting the output signals (having a reset level) of the pixels of the first row R1 to the column lines CLs. Here, the first row selection signal RS1 is activated in the period in which the first row R1 is selected so that only the output signals of the pixels of the given columns C1, C2, C5, and C6 of the first row R1 are transferred to the analog-to-digital conversion units A1, A2, A5 and A6. Next, the selection signal SX(R3) corresponding to the second row R3 is activated (the second row R3 is selected) so that the selection transistors S of the pixels of the second row R3 are turned on and the reset signal RX(R3) corresponding to the second row R3 is activated so that the reset transistors R of the pixels of the second row R3 are turned on, thereby outputting the output signals (having a reset level) of the pixels of the second row R3 to the column lines CLs. Here, the second row selection signal RS2 is activated in the period in which the second row R3 is selected so that only the output signals of the pixels of the remaining columns C3, C4, C7, and C8 except for the given columns of the second row R3 are transferred to the analog-to-digital conversion units A3, A4, A7, and A8.

When the output signals of the pixels of the remaining columns C3, C4, C7, and C8 of the second row R3 are sampled, the output signals of the pixels having the reset level sampled in the first row R1 and the second row R3 are analog-to-digital converted.

The selection signal SX(R1) corresponding to the first row R1 is activated (the first row R1 is selected) in a second sampling period SP2 so that the selection transistors S of the pixels of the first row R1 are turned on and the transmission signal TX(R1) corresponding to the first row R1 is activated so that the transmission transistors T of the pixels of the first row R1 are turned on, thereby outputting the output signals (having a reset level) of the pixels of the first row R1 to the column lines CLs. Here, the first row selection signal RS1 is activated in the period in which the first row R1 is selected so that only the output signals of the pixels of the given columns C1, C2, C5, and C6 of the first row R1 are transferred to the analog-to-digital conversion units A1, A2, A5, and A6. Next, the selection signal SX(R3) corresponding to the second row R3 is activated (the second row R3 is selected) so that the selection transistors S of the pixels of the second row R3 are turned on and the transmission signal RX(R3) corresponding to the second row R3 is activated so that the transmission transistors T of the pixels of the second row R3 are turned on, thereby outputting the output signals (having a signal level) of the pixels of the second row R3 to the column lines CLs. Here, the second row selection signal RS2 is activated in the period in which the second row R3 is selected so that only the output signals of the pixels of the remaining columns C3, C4, C7, and C8 except for the given columns of the second row R3 are transferred to the analog-to-digital conversion units A3, A4, A7, and A8.

When the output signals of the pixels of the remaining columns C3, C4, C7, and C8 of the second row R3 are sampled, the output signals of the pixels having the signal level sampled in the first row R1 and the second row R3 are analog-to-digital converted. In this case, the data are generated by using the output signals having a reset level sampled in the first sampling period SP1 and the output signals having a signal level sampled in the second sampling period SP2.

Based on the process described with reference to FIG. 2, the binning unit 230 sequentially obtains the tuned values of the output of the first analog-to-digital conversion unit A1 and the output of the third analog-to-digital conversion unit A3, the tuned values of the output of the second analog-to-digital conversion unit A2 and the output of the fourth analog-to-digital conversion unit A4, the tuned values of the output of the fifth analog-to-digital conversion unit A5 and the output of the seventh analog-to-digital conversion unit A7, and the tuned values of the output of the sixth analog-to-digital conversion unit A6 and the output of the eighth analog-to-digital conversion unit A8 to sequentially generate the binning data BIN<0:B> corresponding to each tuned value.

Next, 'R2' and 'R4', 'R5' and 'R7' and 'R6' and 'R8' each are the first row and the second row in order and thus, the binning data BIN<0:B> generated by the same process are combined, thereby acquiring the data for the images.

Figure 4:
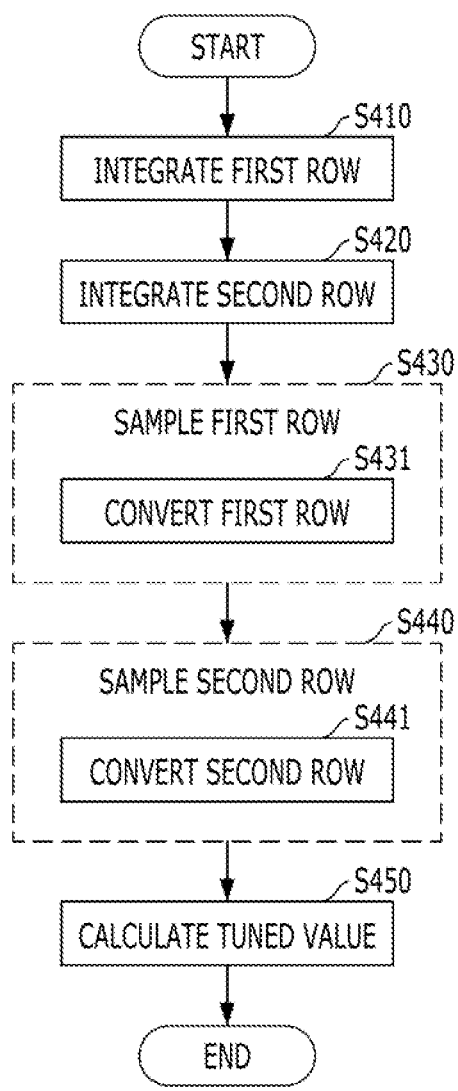
FIG. 4 is a flow chart for describing a method of operating an image sensor in accordance with another embodiment of the present invention.

FIG. 4 is a flow chart for describing a method of operating an image sensor in accordance with another embodiment of the present invention. The image sensor in accordance with the embodiment of the present invention includes the pixel array 210 that includes the plurality of pixels corresponding to the plurality of rows R1 to R8 and the columns C1 to C8.

As illustrated in FIG. 4, method of operating an image sensor includes integrating photo charges in the pixels of the first row for the first period prior to sampling the output signals of the pixels of the given columns C1, C2, C5, and C6 of the first row (S410), integrating photo charges in the pixels of the second row for the second period longer than the first period prior to sampling the pixel data of the remaining columns C3, C4, C7, and C8 of the second row (S420), sampling the pixel data of the given columns C1, C2, C5, and C6 of the first row in the pixel array 210 (S430), sampling the pixel data of the remaining columns C3, C4, C7, and C8 of the second row in the pixel array 210 (S440), and calculating the weighted tuned values of the values of the pixel data of at least one of the given columns C1, C2, C5, and C6 of the first row and the values of the pixel data of at least one of the remaining columns C3, C4, C7, and C8 of the second row.

Hereinafter, the method of operating an image sensor in accordance with the embodiment of the present invention will be described with reference to FIGS. 2 to 4.

The first row and the second row are a row having the integration time that is set differently and prior to sampling the output signals of the pixels included in the first row and the second row, the pixels of the first row integrate photo charges for the first period (hereinafter, referred to as the 'integrating of the first row' (S410)) and the pixels of the second row integrate photo charges for the second period (hereinafter, referred to as the 'integrating of the second row' (S420)). The 'integrating of the first row' (S410) and the 'integrating of the second row' (S420) may also be performed together in order. When the 'integrating of the first row' (S410) and the 'integrating of the second row' (S420) are completed, the pixels of the first row and the pixels of the second row are integrated with the photo charges corresponding to the amount of light incident to each pixel.

After the 'integrating of the first row' (S410) is completed, the pixel data of the given columns C1, C2, C5, and C6 of the first row are sampled by the data sampling unit 220 (hereinafter, referred to as the 'sampling of the first row' (S430)) and after the 'integrating of the second row' (S420) is completed, the pixel data of the columns except for the remaining columns C3, C4, C7, and C8 of the second row are sampled by the data sampling unit 220 (hereinafter, referred to as the 'sampling of the second row' (S440)). The 'sampling of the first row' (S430) and the 'sampling of the second row' (S440) may also be performed together in order.

In the 'sampling of the first row' (S430) only the output signals of the pixels of the given columns C1, C2, C5, and C6 of the first row are transferred to the analog-to-digital conversion units A1 A2, A5, and A6 and in the 'sampling of the second row' (S440), a process of transferring only the output signals of the pixels of the remaining columns C3, C4, C7, and C8 of the second row to the analog-to-digital conversion units A3, A4, A7, and A8 is the same as the foregoing in the description of FIG. 3.

The 'sampling of the first row' (S430) may include converting the output signals of the pixels of the given columns C1, C2, C5, and C6 of the first row into the data that are the digital signals in the period in which the first row is selected (hereinafter, referred to as the 'converting of the first row' (S431)) and the 'sampling of the second row' (S440) may include converting the output signals of the pixels of the second columns C3, C4, C7, and C8 of the second row into the data that are the digital signals in the period in which the second row is selected (hereinafter, referred to as the 'converting of the second row' (S441)). The 'converting of the first row' (S431) and the 'converting of the second row' (S441) may also be performed together in order.

In the 'converting of the first rove' (S431) and the 'converting of the second row' (S441), at least one analog-to-digital conversion unit A1 to A8 converts the output signals of the pixels transferred thereto into the data that are the digital signals.

The binning unit 230 calculates the tuned values of the data generated in the 'sampling of the first row' (S430) and the 'sampling of the second row' (S440) to generate the binning data BIN<0:B> (hereinafter, referred to as the 'calculating of the tuned value' (S450)). In this case, in the 'calculating of the tuned value' (S450), the binning unit 230 may also calculate the tuned values without allocating the weighted values to the value of each data and may calculate the tuned values by allocating the weighted values to the value of each data. The reason of allocating the weighted values to the values of each data is to enable a human to identify objects within the image well. If the tuned values are calculated by allocating the weighted values to the values each data, when the values of the pixel data of at least one of the given columns C1, C2, C5, and C6 of the first row and the values of the pixel data of at least one of the remaining columns C3, C4, C7, and C8 of the second row are smaller than the target value TAR<0:B>, the weighted tuned values are calculated by allocating the larger weighted values to the values of the pixel data output from at least one of the remaining columns C3, C4, C7, and C8 of the second row and when the values of the pixel data of at least one of the given columns C1, C2, C5, and C6 of the first row and the values of the pixel data of at least one of the remaining columns of the second row are larger than the target value TAR<0:B>, the tuned values are calculated by allocating the larger weighted value to the values of the pixel data of at least one of the given columns C1, C2, C3, and C6 of the first row.

Describing in more detail the method of obtaining the tuned values by the binning unit 230, the following two methods may be used. Hereinafter, the data output from one of the given columns C1, C2 C5, and C6 of the first row R1 is the first data and the data output from a column adjacent to the column outputting the first data among the remaining columns C3, C4, C7, and C8 of the second row R2 is a second data. That is, the first data is the pixel data having the short integration time and the second data is the pixel data having the long integration time. For example, when the data obtained by converting the output signal of the pixel of 'C1' of the first row R1 into the digital signal is the first data, the data obtained by converting the output signal of the pixel of 'C3' of the second row R3 into the digital signal is the second data.

The binning unit 230 allocates the larger weighted value to the values of the second data when the values of the first data and the second data are smaller than the target value TAR<0:B> and calculates the average of the first data and the second data and allocates the larger weighted value to the values of the first data when the values of the first data and the second data are larger than the target value TAR<0:B> and calculates the average of the first data and the second data.

(1) The binning unit 230 may calculate the tuned values of the first data and the second data depending on the above Equation 1 when the values of the first data and the second data are larger than the target value TAR<0:B> and calculate the tuned values of the first data and the second data depending on the above Equation 2 when at least one of the values of the first data and the second data is smaller than the target value TAR<0:B>.

(2) In addition, the binning unit 230 may calculate the tuned values of the first data and the second data depending on the above Equation 3.

Here, the maximum value of the data means a maximum value of a code that may be included in the pixel data. For example, when the pixel data is 8 bits, the maximum value of the data becomes '11111111'. For reference, as the brightness of sampled light in the pixel is dark, the value of the pixel data approximates '00000000' and as the brightness of sampled light in the pixel is bright, the value of the pixel data approximates '11111111'.

The tuned values are generated using the first data and the second data based on the method (1) or (2), thereby increasing the gradation expression of the dark portion or the bright portion in the image.

The image (that is, a set of the binning data BIN<0:B>) acquired by the method of operating an image sensor as described above has both of the advantage (having the abundant gradation expression in the bright area) of the pixel data having the short integration time and the advantage (having the abundant gradation expression in the dark area) of the pixel data having the short integration time. Further, the tuned values are calculated whenever each data is generated without storing the digitally converted data, so that the memory for storing the converted data is not required, thereby reducing the area of the image sensor. Further, all the pixel data of the overall pixel array 210 are not sampled but some pixel data are sampled (in the case of the image sensor of FIG. 2, a half of all the pixels are sampled), so that the sampling rate may be rapid and the image acquiring speed may be rapid (increased frame rate).

In accordance with the embodiments of the present invention, it may be possible to rapidly acquire (increased frame rate) the image data with the abundant gradation expression in the dark area and the bright area by implementing the fast image acquiring speed and the wide dynamic range since the image is acquired by sampling the pixel data having the different integration time together and calculating the tuned value of the value of the sampled data.

Further, in accordance with the exemplary embodiments of the present invention, it may be possible to reduce the area of the image sensor since there is no store the pixel data having the different integration time by sampling the data of pixels having the different integration time together and calculating the tuned value without separately storing the data to acquire the image.

Although the spirit of the present invention was described in detail with reference to the preferred embodiments, it should be understood that the preferred embodiments are provided to explain, but do not limit the spirit of the present invention. Also, it is to be understood that various changes and modifications within the technical scope of the present invention are made by a person having ordinary skill in the art to which this invention pertains.

What is claimed is:

1. An image sensor comprising:
  a pixel array configured to include a plurality of pixels corresponding to a plurality of rows and a plurality of columns that include one or more first column groups and one or more second column groups and are disposed in a direction crossing the plurality of rows; and
  a data sampling unit configured to sample pixel data of a first column group of a first row and to sample pixel data of a second column group of a second row,
  wherein the first column group and the second column group are alternatively arranged.

2. The image sensor of claim 1, wherein the pixels of the first row integrate photo charges for a first period and the pixels of the second row integrate photo charges for a second period longer than the first period.

3. The image sensor of claim 1, wherein the data sampling unit samples the pixel data of the first column group of the first row and the pixel data of the second column group of the second row together.

4. The image sensor of claim wherein the data sampling unit samples the pixel data of the first column group of the first row in a period in which the first row is selected and the pixel data of the second column group of the second row in a period in which the second row is selected.

5. The image sensor of claim wherein the first and second rows are adjacent to each other among rows having the same pixel patterns as each other in the pixel array.

6. The image sensor of claim 5, wherein in the pixel array, the first column group includes at least one column, and the second column group includes at least one column.

7. The image sensor of claim 6, wherein the data sampling unit includes:
  at least one analog-to-digital conversion unit configured to correspond to at least one of the plurality of columns, and convert output signals of the pixels output from the respective column into data of digital signals;
  at least one voltage transfer unit configured to correspond to at least one of the plurality of columns, and transfer or block the output signals of the pixels output from the respective column to/from the analog-to-digital conversion units; and
  a control unit configured to activate the voltage transfer units corresponding to the columns included in the first column group in the period in which the first row is selected, and activate the voltage transfer units corresponding to the columns included in the second column group in the period in which the second row is selected.

8. The image sensor of claim 7, wherein the control unit controls the pixels of the first row to integrate photo charges for a first period and the pixels of the second row to integrate photo charges for a second period longer than the first period.

9. The image sensor of claim 7, wherein the control unit outputs the output signals of the pixels of the first row in the period in which the first row is selected, and the output signals of the pixels of the second row in the period in which the second row is selected.

10. The image sensor of claim 7, wherein the analog-to-digital conversion unit converts the output signals of the pixels transferred from the activated voltage transfer unit in the period in which the first row is selected, and the output signals of the pixels transferred from the activated voltage transfer unit in the period in which the second row is selected, into the data together.

11. The image sensor of claim 1, further comprising:
 a binning unit configured to calculate tuned values of the pixel data output from at least one of the first column group of the first row and the pixel data output at least one of the second column group of the second row.

12. The image sensor of claim 11, wherein the binning unit calculates the tuned values by allocating larger weighted values to the pixel data output from at least one of the second column group of the second row, when the values of the pixel data output from at least one of the first column group of the first row and the values of the pixel data output from at least one of the second column group of the second row are smaller than the target value, and calculates the tuned values by allocating the larger weighted values to the pixel data output from at least one of the first column group of the first row, when the values of the pixel data output from at least one of the first column group of the first row and the values of the pixel data output from at least one of the second column group of the second row are larger than the target value.

13. The image sensor of claim 1, wherein the data output from one of the first column group of the first row is a first data, the data output from a column adjacent to the column outputting the first data, among the second column group of the second row, is a second data, and the binning unit calculates the tuned values of the first data and the second data.

14. The image sensor of claim 13, wherein the binning unit calculates the tuned values of the first data and the second data by allocating larger weighted values to the second data when the values of the first data and the second are smaller than a target value, and calculates the tuned values of the first data and the second data by allocating the larger weighted values to the first data when the values of the first data and the second data are larger than the target value.

15. The image sensor of claim 13, wherein the binning unit calculates the tuned values of the first data and the second data depending on the following Equation 1 when the values of the first data and the second data are larger than the target value, and calculates the tuned values of the first data and the second data depending on the following Equation 2 when at least one of the values of the first data and the second data is smaller than the target value $$\frac{\left(\begin{array}{l}\text{value of first data} * \text{value of second data} + \\ \text{value of second data} * \text{value of first data}\end{array}\right)}{(\text{value of first data} + \text{value of second data})} \quad \text{[Equation 1]}$$

$$\frac{\left(\begin{array}{l}\text{value of first data} * \text{value of first data} + \\ \text{value of second data} * \text{value of second data}\end{array}\right)}{(\text{value of first data} + \text{value of second data})} \quad \text{[Equation 2]}$$

16. The image sensor of claim 13, wherein the binning unit calculates the tuned values of the first data and the second data depending on the following wing Equation 3

$$\frac{\left[\begin{array}{l}\text{value of second data} * \\ \left(\begin{array}{l}\text{maximum value of data} - \\ \text{value of first data}\end{array}\right) + \\ \text{value of first data} * \text{value of first data}\end{array}\right]}{\text{maximum value of data}} \quad \text{[Equation 3]}$$

17. A method of operating an image sensor including a plurality of pixels corresponding to a plurality of rows and a plurality of columns where include one or more first column groups and one or more second column groups and are disposed in a direction crossing the plurality of rows, the method comprising:
 sampling pixel data of a first column group of a first row in the pixel array; and
 sampling pixel data of the second column group where are alternatively arranged with the first column group.

18. The method of claim 17, further comprising:
 integrating photo charges for a first period in the pixels of the first row prior to sampling the pixel data of the first column group of the first row; and
 integrating photo charges for a second period longer than the first period in the pixels of the second row prior to sampling the pixel data of the second column group of the second row.

19. The method of claim 17, further comprising:
 calculating tuned values of the pixel data of at least one of the first column group of the first row and the pixel data of at least one of the second column group of the second row.

20. The method of claim 19, wherein in the calculating of the tuned values,
 the tuned values are calculated by allocating larger weighted values to the pixel data output from at least one of the second column group of the second row, when the values of the pixel data output from at least one of the first column group of the first row and the values of the pixel data output from at least one of the second column group of the second row are smaller than the target value, and
 the tuned values are calculated by allocating the larger weighted values to the pixel data output from at least one of the first column group of the first row, when the values of the pixel data output from at least one of the first column group of the first row and the values of the pixel data output from at least one of the second column group of the second row are larger than the target value.

21. The method of claim 19, wherein the data output from one of the first column group of the first row is a first data, the data output from a column adjacent to the column outputting the first data, among the second column group of the second row, is a second data, and the binning unit calculates the tuned values of the first data and the second data.

22. The method of claim 21, wherein in the calculating of the tuned values, the tuned values of the first data and the second data are calculated by allocating larger weighted values to the second data when the values of the first data and the second are smaller than a target value, and the tuned values of the first data and the second data are calculated by allocating the larger weighted values to the first data when the values of the first data and the second data are larger than the target value.

23. The method of claim 21, wherein in the calculating of the tuned values, the tuned values of the first data and the second data are calculated depending on the following Equation 1 when the values of the first data and the second data are larger than the target value, and the tuned values of the first data and the second data are calculated depending on the following Equation 2 when at least one of the values of the first data and the second data is smaller than the target value $$\frac{\left(\begin{array}{c}\text{value of first data} * \text{value of second data} + \\ \text{value of second data} * \text{value of first data}\end{array}\right)}{(\text{value of first data} + \text{value of second data})} \quad \text{[Equation 1]}$$

$$\frac{\left(\begin{array}{c}\text{value of first data} * \text{value of first data} + \\ \text{value of second data} * \text{value of second data}\end{array}\right)}{`(\text{value of first data} + \text{value of second data})}. \quad \text{[Equation 2]}$$

24. The method of claim 21, wherein in the calculating of the tuned values, the tuned values of the first data and the second data are calculated depending on the following Equation 3

$$\frac{\left(\begin{array}{c}\text{value of second data} * \\ \left(\begin{array}{c}\text{maximum value of data} - \\ \text{value of first data}\end{array}\right) + \\ \text{value of first data} * \text{value of first data}\end{array}\right)}{\text{maximum value of data}}. \quad \text{[Equation 3]}$$

25. The method of claim 17, wherein the sampling of the pixel, data of the first column group of the first row includes converting the output signals of the first column group of the first row in the period in which the first row is selected, into data of digital signals, and the sampling of the pixel data of the second column group of the second row includes converting the output signals of the pixels of the second column group of the second row in the period in which the second row is selected, into data of digital signals.

\* \* \* \* \*

UNITED STATES PATENT AND TRADEMARK OFFICE
CERTIFICATE OF CORRECTION

| | | |
|---|---|---|
| PATENT NO. | : 8,946,614 B2 | Page 1 of 1 |
| APPLICATION NO. | : 13/716364 | |
| DATED | : February 3, 2015 | |
| INVENTOR(S) | : Young-Hwan Yun | |

It is certified that error appears in the above-identified patent and that said Letters Patent is hereby corrected as shown below:

On the Title Page

Change the References Cited section as follows:

FOREIGN PATENT DOCUMENTS

| KR | 1020070064613 | 6/2007 |
| KR | 1020070064833 | 6/2007 |
| KR | 1020070065329 | 6/2007 |
| KR | 1020090000503 | 1/2009 |

Signed and Sealed this
Twenty-eighth Day of July, 2015

Michelle K. Lee
*Director of the United States Patent and Trademark Office*